(12) United States Patent
Hirata

(10) Patent No.: US 7,345,519 B2
(45) Date of Patent: Mar. 18, 2008

(54) FLIP-FLOP CIRCUIT

(75) Inventor: Akio Hirata, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 71 days.

(21) Appl. No.: 11/489,537

(22) Filed: Jul. 20, 2006

(65) Prior Publication Data

US 2007/0018706 A1    Jan. 25, 2007

(30) Foreign Application Priority Data

Jul. 21, 2005    (JP)    ............... 2005-211690

(51) Int. Cl.
     *H03K 3/356*      (2006.01)
(52) U.S. Cl. ............... 327/208; 327/218; 327/200; 326/95; 326/98
(58) Field of Classification Search ............... 327/199, 327/202, 203, 208–212, 214, 218, 225; 326/93, 326/95, 98
See application file for complete search history.

(56) References Cited

U.S. PATENT DOCUMENTS

| | | | |
|---|---|---|---|
| 5,898,330 A | | 4/1999 | Klass |
| 5,917,355 A | * | 6/1999 | Klass ............... 327/208 |
| 5,933,038 A | * | 8/1999 | Klass ............... 327/208 |
| 6,023,179 A | | 2/2000 | Klass |
| 6,853,228 B2 | * | 2/2005 | Hirata et al. ............... 327/199 |
| 2005/0151560 A1 | * | 7/2005 | Hirata ............... 326/16 |
| 2005/0283691 A1 | | 12/2005 | Chae |

FOREIGN PATENT DOCUMENTS

| | | |
|---|---|---|
| JP | 2004-159315 | 6/2004 |
| JP | 2005-210683 | 8/2005 |

OTHER PUBLICATIONS

Klass 'Semi-Dynamic and Dynamic Flip-Flops with Embedded Logic': Fabian Klass, Sun Microsystems Inc., 1998 Symposium on VLSI Circuits Digest of Technical Papers, pp. 108, 109.

* cited by examiner

*Primary Examiner*—Tuan T. Lam
*Assistant Examiner*—Patrick O'Neill
(74) *Attorney, Agent, or Firm*—McDermott Will & Emery LLP

(57) ABSTRACT

A scan flip-flop circuit including an input section employing a dynamic circuit and an output section employing a static circuit, capable of latching in data within a period of a pulse width that is shorter than the clock cycle, wherein only three N-type transistors are connected in series in the input section employing a dynamic circuit. A data signal is input directly to one of the three N-type transistors. On the other hand, a test input signal is input to an AND/OR inverter circuit. The AND/OR inverter circuit receives, as a control signal, the potential of the node obtained as the clock signal passes through two inverter circuits. Therefore, there is required only a short hold time for the test input signal.

14 Claims, 9 Drawing Sheets

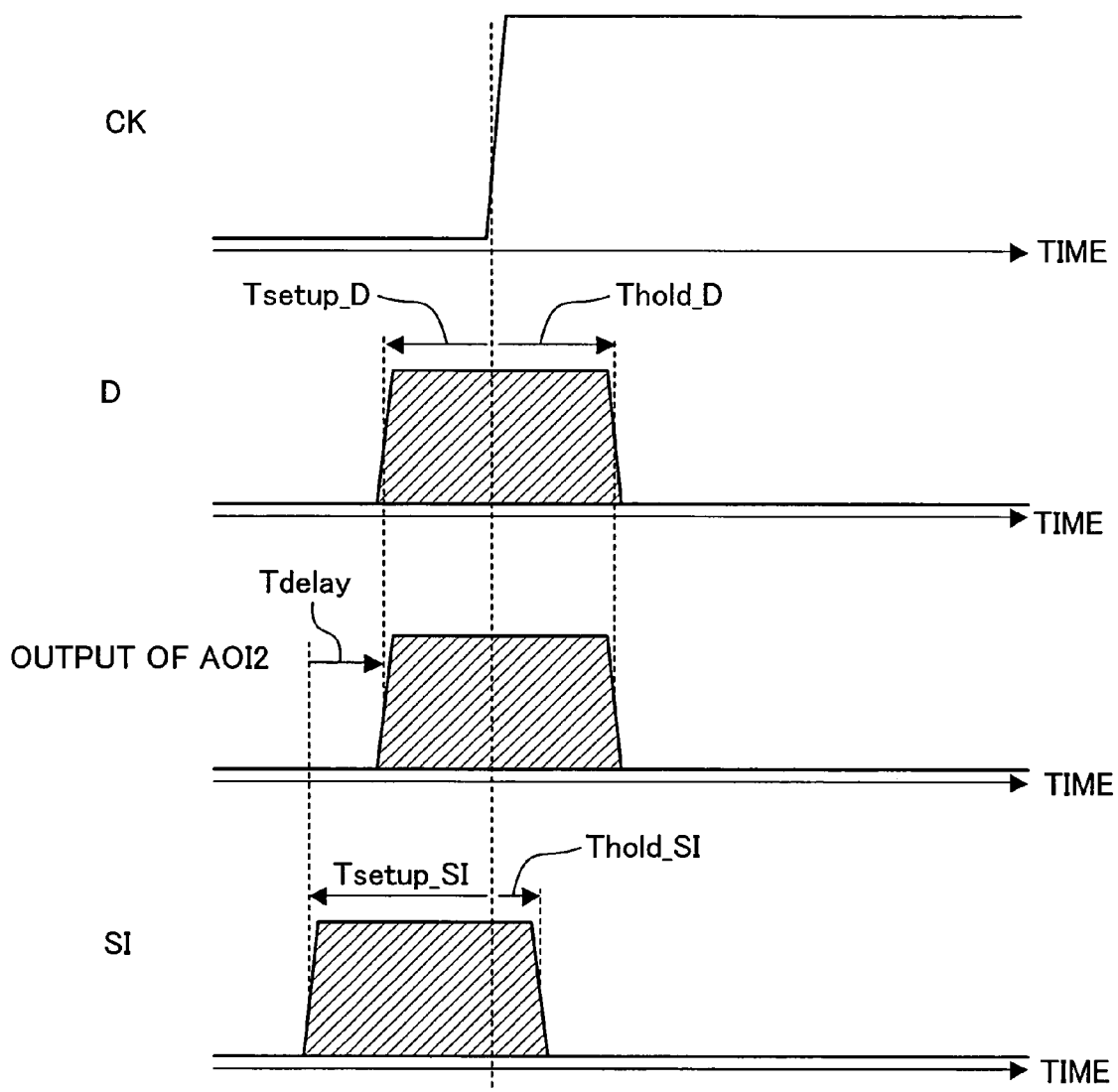

US 7,345,519 B2

FLIP-FLOP CIRCUIT

CROSS REFERENCE TO RELATED APPLICATION

This Non-provisional application claims priority under 35 U.S.C. §119(a) on Patent Application No. 2005-211690 filed in Japan on Jul. 21, 2005, the entire contents of which are hereby incorporated by reference.

BACKGROUND OF THE INVENTION

The present invention relates to a flip-flop circuit that operates at a high speed and can be configured with a small number of transistors. More particularly, the present invention relates to a flip-flop circuit capable of selectively storing one of a plurality of data inputs or a flip-flop circuit with a scan function.

Flip-flop circuits account for a significant part, among other logic circuits in a semiconductor integrated circuit, in terms of the area, the power consumption and the critical path delay. Accordingly, there is a demand for a flip-flop circuit with a smaller area, a lower power consumption and a higher speed. Particularly, scan flip-flop circuits are often used for easy testing of LSIs being designed, and it is therefore important to realize a scan flip-flop circuit with a smaller area, a lower power consumption and a higher speed.

Recently, a flip-flop circuit is proposed in the art for high-speed applications, which employs a latch circuit capable of latching in data within a period of a pulse width that is shorter than the clock cycle. Conventional flip-flop circuits having such configurations will now be described with reference to circuit diagrams of FIGS. 8 and 9.

FIG. 8 shows a scan flip-flop circuit of a type called "SDFF (Semi-Dynamic Flip-Flop)", including an input section using a dynamic circuit and an output section using a static circuit. This is one exemplary configuration described in U.S. Pat. No. 5,898,330 (hereinafter referred to as "Conventional Example 1").

In FIG. 8, D denotes a data signal, CK a clock signal, SI a test input signal, SCAN a test selection signal, Q an output signal, VDD a VDD power supply, and GND a GND potential.

N20 to N23 are N-type transistors. A series of N-type transistors N20 and N21 and another series of N-type transistors N22 and N23 are connected in parallel to each other to form a selector circuit. In this configuration, the control of the N-type transistor N21 with the data signal D and the control of the N-type transistor N23 with the test input signal SI is exclusively selected by the N-type transistor N20, which is controlled by the test selection signal SCAN inverted through an inverter circuit INV7, and the N-type transistor N22, which is controlled by the test selection signal SCAN.

P1 is a P-type transistor whose source is connected to the VDD power supply, and N3 is an N-type transistor whose source is connected to the GND potential. The gates of these transistors each receive a clock signal CK. The N-type transistor N1 is connected in series with the drain of the P-type transistor P1, and the selector circuit as described above is inserted in series between the source of the N-type transistor N1 and the drain of the N-type transistor N3. The connection node between the drain of the P-type transistor P1 and the drain of the N-type transistor N1 is X1. The output terminal of a 2-input NAND circuit ND1 is connected to the gate of the N-type transistor N1. One input terminal of the NAND circuit ND1 is connected to the node X1, and the other input terminal receives the clock signal CK being delayed through two inverter circuits INV1 and INV2. The connection node between the inverter circuit INV2 and the other input terminal of the NAND circuit ND1 is CKD.

The node X1 is connected to the gate of a P-type transistor P2, whose source is connected to the VDD power supply, and to the gate of an N-type transistor N5, whose source is connected to the GND potential. An N-type transistor N4, whose gate receives the clock signal CK, is inserted in series between the P-type transistor P2 and the N-type transistor N5. The output potential obtained from the connection node between the P-type transistor P2 and the N-type transistor N4 is the output signal Q.

The latch circuit including inverter circuits INV3 and INV4 is connected to the node X1, and the latch circuit including inverter circuits INV5 and INV6 is connected to the drain of the P-type transistor P2 outputting the output signal Q.

Next, the operation of the scan flip-flop circuit having such a configuration will be described.

First, the operation where the test selection signal SCAN is at a low level, i.e., where the data signal D is being selected, will be described.

During a period in which the clock signal CK is at the low level, the potential of the node X1 goes high as the P-type transistor P1 is turned ON. Then, the N-type transistor N4 and the P-type transistor P2 are cut off, whereby the output signal Q is held at the previous value.

Then, when the clock signal CK transitions to a high level, the potential of the node CKD does not transition to the high level immediately but does so after the delay through the inverter circuits INV1 and INV2. During the period in which the clock signal CK is at the high level and the potential of the node CKD is at the low level (hereinafter referred to as the "evaluation period"), the N-type transistor N1 is ON. Therefore, if the data signal D is at the high level in this period, the node X1 transitions from the high level to the low level, and the output signal Q is transitioned to the high level by the P-type transistor P2. If the input signal D is at the low level in the evaluation period, the node X1 remains at the high level and the output signal Q is transitioned to the low level by the N-type transistors N4 and N5.

Then, the circuit transitions to a state where the clock signal CK is at the high level and the potential of the node CKD is at the high level (hereinafter referred to as the "hold period"). In this period, if the potential of the node X1 is at the high level, the N-type transistor N1 is cut off by the 2-input NAND circuit ND1, whereby the high level potential is held by the inverter circuits INV3 and INV4 without being influenced by the value of the data signal D. Where the circuit enters the hold period with the node X1 being at the low level, since the P-type transistor P1 is cut off, the potential of the node X1 is held at the low level by the inverter circuits INV3 and INV4, irrespective of the value of the input signal D.

Normally, an inverter circuit includes two transistors and a 2-input NAND circuit includes four transistors. Accordingly, the flip-flop circuit of Conventional Example 1 shown in FIG. 8 can be realized with a total of 28 transistors.

FIG. 9 shows an alternative configuration of a scan flip-flop circuit of the type called "SDFF" (hereinafter referred to as "Conventional Example 2"). Like elements to those shown in FIG. 8 are denoted by like reference numerals and will not be further described below.

The scan flip-flop circuit of FIG. 9 has the same function as that of FIG. 8. However, the scan flip-flop circuit of FIG.

9 does not include the N-type transistor N1 and the NAND circuit ND1, which are provided in the circuit of FIG. 8 for holding the potential of the node X1 at the high level in the hold period. Instead, the scan flip-flop circuit of FIG. 9 additionally includes an AND/OR inverter circuit AOI1 and an AND/OR inverter circuit AOI2. The AND/OR inverter circuit AOI1 includes a 2-input AND circuit and an OR inverter circuit receiving the output from the 2-input AND circuit and the test selection signal SCAN, and AND/OR inverter circuit AOI2 similarly includes a 2-input AND circuit and an OR inverter circuit receiving the output from the 2-input AND circuit and a signal obtained by inverting the test selection signal SCAN through the inverter circuit INV7.

Thus, with the data signal D being at the low level, if the clock signal CK rises from the low level to the high level, the potential of the node CKD transitions from the low level to the high level in the hold period, whereby the N-type transistors N20 and N22 are cut off, irrespective of the value of the test selection signal SCAN. Therefore, the potential of the node X1 is held at the high level, irrespective of the value of the data signal D, thus providing a similar function to that of the N-type transistor N1 of FIG. 8.

Since an AND/OR inverter circuit normally includes six transistors, the circuit shown in FIG. 9 includes a total of 35 transistors.

However, in the scan flip-flop circuit shown in FIG. 8, a maximum of four N-type transistors are connected together in series, thereby increasing the delay time.

In the scan flip-flop circuit shown in FIG. 9, the number of transistors to be connected together in series is three, thus realizing a shorter delay time as compared with the circuit of FIG. 8. However, the circuit of FIG. 9 requires as many as 35 transistors.

Moreover, with the scan flip-flop circuits of FIGS. 8 and 9, if the circuit attempts to take in the test input signal SI being low when the clock signal CK is transitioning from low to high, the test input signal SI needs to be held at the low level from when the clock starts rising until the output from the NAND circuit ND1 (or the AND/OR inverter circuit AOI2) is transitioned from high to low by the inverter circuit INV2, after the clock is delayed through the inverter circuits INV1 and INV2, to thereby cut off the transistor N1 (or the transistor N22). Thus, the flip-flop circuits have a long hold time.

SUMMARY OF THE INVENTION

It is an object of the present invention to provide a scan flip-flop circuit, in which the number of N-type transistors to be connected together in series is reduced to three, thereby limiting the number of constituent transistors to be fewer than that of the flip-flop circuit shown in FIG. 9 while increasing the operating speed.

In order to achieve the object, the present invention reduces the number of transistors needed by devising improvements to the signal input-output relationship, etc.

Specifically, a flip-flop circuit of the present invention includes: an input section including a plurality of transistors for receiving first logic information including a clock signal, a first data signal, a second data signal and an input selection signal to output second logic information based on the first logic information; a control section for producing a control signal being dependent at least on the clock signal; and an output section for outputting a signal based on the second logic information, wherein: the second logic information is transmitted from the input section to the output section via a first node; the input section outputs, to the first node, the second logic information as a signal of a second logic level when the clock signal is at a first logic level, and outputs, to the first node, a signal determined based on the first logic information and the control signal when the clock signal transitions from the first logic level to the second logic level; in the input section, the first data signal is input to a gate terminal of a first transistor included in a first path, along which a current flows when the first node transitions from the second logic level to the first logic level; and in the input section, an output signal of a first logic gate, which receives at least the control signal and the second data signal, is input to a gate terminal of a second transistor included in a second path, along which a current flows when the first node transitions from the second logic level to the first logic level, the second path does not include the first transistor.

In one embodiment of the present invention, an output signal of a second logic gate, which receives at least the input selection signal and the control signal, is input to a gate terminal of a third transistor, which is connected in series with the first transistor and which is included in the first path; and the input selection signal is input to a gate terminal of a fourth transistor, which is connected in series with the second transistor and which is included in the second path.

Another flip-flop circuit of the present invention includes: an input section including a plurality of transistors of a second polarity and receiving a clock signal, a first data signal, a second data signal and an input selection signal; a latch circuit for latching an output of the input section; a control section including a first node; and an output section for outputting a signal from an output terminal, wherein: the input section includes a first transistor of a first polarity provided between a first potential supply node and a second node, a first transistor of the second polarity whose drain is connected to the second node, and first and second logic blocks connected in parallel between a source of the first transistor of the second polarity and a second potential supply node; the first logic block includes second and third transistors of the second polarity connected in series, the second logic block including fourth and fifth transistors of the second polarity connected in series; the clock signal is input to a gate terminal of the first transistor of the first polarity and a gate terminal of the first transistor of the second polarity; the input selection signal is input to a gate terminal of the second transistor of the second polarity, and an output signal of a first logic gate, which receives a control signal supplied via the first node and the second data signal, is input to a gate terminal of the third transistor of the second polarity; the first data signal is input to a gate terminal of the fourth transistor of the second polarity, and an output signal of a second logic gate, which receives the control signal supplied via the first node and the input selection signal, is input to a gate terminal of the fifth transistor of the second polarity; the latch circuit includes a first inverter for receiving a signal supplied via the second node of the input section to output, to a third node, a signal obtained by inverting a logic of the received signal, and a second inverter for receiving a signal supplied via the third node to output, to an input of the first inverter, a signal obtained by inverting a logic of the received signal; the control section includes a second transistor of the first polarity, a third transistor of the first polarity, and a fourth transistor of the second polarity; the second transistor of the first polarity and the fourth transistor of the first polarity are provided in series between the first potential supply node and the third node; the third transistor of the first polarity is provided between the first potential supply node and the first node, the first node being an intermediate node between the second transistor of the first polarity and the fourth transistor of the second polarity; the clock signal is input to a gate terminal of the second transistor of the first polarity and a gate terminal of the fourth transistor of the second polarity; a signal having a logic that is dependent on a logic of a signal output from the output terminal or the first node is input to a gate terminal of the third transistor of the first polarity; and the output section, receiving a signal supplied via the first node of the control section and a signal supplied via the third node of the latch circuit, holds a signal level of the output terminal when the signal supplied via the first node of the control section is at a second logic level and the signal supplied via the third node of the latch circuit is at a first logic level, outputs to the output terminal a signal of a logic dependent on the signal supplied via the first node when the signal supplied via the first node of the control section is at the first logic level, and outputs a signal of a logic dependent on the signal supplied via the third node when the signal supplied via the third node is at the second logic level.

Still another flip-flop circuit of the present invention includes: an input section including a plurality of transistors of a second polarity and receiving a clock signal, a first data signal, a second data signal and an input selection signal; a latch circuit for latching an output of the input section; a control section including a first node; and an output section for outputting a signal from an output terminal, wherein: the control section receives the clock signal and outputs a control signal being dependent on an output of a delay element for delaying the clock signal by a predetermined period and outputting the delayed signal; the input section includes a first transistor of a first polarity provided between a first potential supply node and a second node, a first transistor of the second polarity whose drain is connected to the second node, and first and second logic blocks connected in parallel between a source of the first transistor of the second polarity and second potential supply node; the first logic block includes second and third transistors of the second polarity connected in series, and the second logic block includes fourth and fifth transistors of the second polarity connected in series; the clock signal is input to a gate terminal of the first transistor of the first polarity and a gate terminal of the first transistor of the second polarity; the input selection signal is input to a gate terminal of the second transistor of the second polarity, and an output signal of a first logic gate, which receives a control signal supplied via the first node and the second data signal, is input to a gate terminal of the third transistor of the second polarity; the first data signal is input to a gate terminal of the fourth transistor of the second polarity, and an output signal of a second logic gate, which receives the control signal supplied via the first node and the input selection signal, is input to a gate terminal of the fifth transistor of the second polarity; the latch circuit includes a first inverter for receiving a signal supplied via the second node of the input section to output, to a third node, a signal obtained by inverting a logic of the received signal, and a second inverter for receiving a signal supplied via the third node to output, to an input of the first inverter, a signal obtained by inverting a logic of the received signal; and the output section holds a signal of the output terminal when a signal of a first logic level is applied to a clock terminal, and outputs to the output terminal a signal of a logic dependent on a signal of the second node when a signal of a second logic level is applied to the clock terminal.

In one embodiment of the present invention, the first and second logic gates are each an inverted logical sum circuit.

In one embodiment of the present invention, a single transistor of a first polarity is used in a shared manner as a transistor of the first polarity, which forms a part of the inverted logical sum circuit being the first logic gate and a gate terminal of which receives the control signal, and as a transistor of the first polarity, which forms a part of the inverted logical sum circuit being the second logic gate and a gate terminal of which receives the control signal.

In one embodiment of the present invention, the input section receives a group of three or more data signals, including the first and second data signals; and the flip-flop circuit includes three or more logic blocks receiving the group of data signals and including the first and second logic blocks.

Thus, with the flip-flop circuit of the present invention, it is possible to eliminate the inverter circuit INV7 for inverting the selection signal, which is provided in the conventional flip-flop circuit of FIG. 9, for example, whereby it is possible to realize a flip-flop circuit with a smaller number of transistors than that of conventional flip-flop circuits, with the number of N-type transistors to be connected together in series being three, for example. Therefore, where the flip-flop circuit of the present invention is used as a scan flip-flop circuit, if the data signal of the normal operation mode is used as the first data signal and the test input signal in the test mode as the second data signal, the flip-flop circuit can operate at a faster speed, in the normal operation mode where a high-speed operation is required, than a conventional flip-flop circuit in which the number of N-type transistors connected together in series is four.

Moreover, where the flip-flop circuit of the present invention is used as a scan flip-flop circuit, in the test mode where a high-speed operation is not required and the hold time is required to be short, the second input signal is not solely input to the N-type transistor but is input to the first logic gate, to which the control signal is input, whereby it is possible to shorten the hold time of the second input signal by the delay time through the first logic gate.

BRIEF DESCRIPTION OF THE DRAWINGS

FIG. 3 is a timing diagram showing the characteristics of the hold time of the flip-flop circuit.

DETAILED DESCRIPTION OF THE INVENTION

Preferred embodiments of the present invention will now be described with reference to the drawings.

Embodiment 1

A flip-flop circuit according to Embodiment 1 of the present invention will now be described with reference to the drawings.

While the present invention will be described below primarily with respect to applications where the present invention is used as a scan flip-flop circuit, the present invention may be used as an ordinary flip-flop circuit with a 2-input selector.

Figure 1:
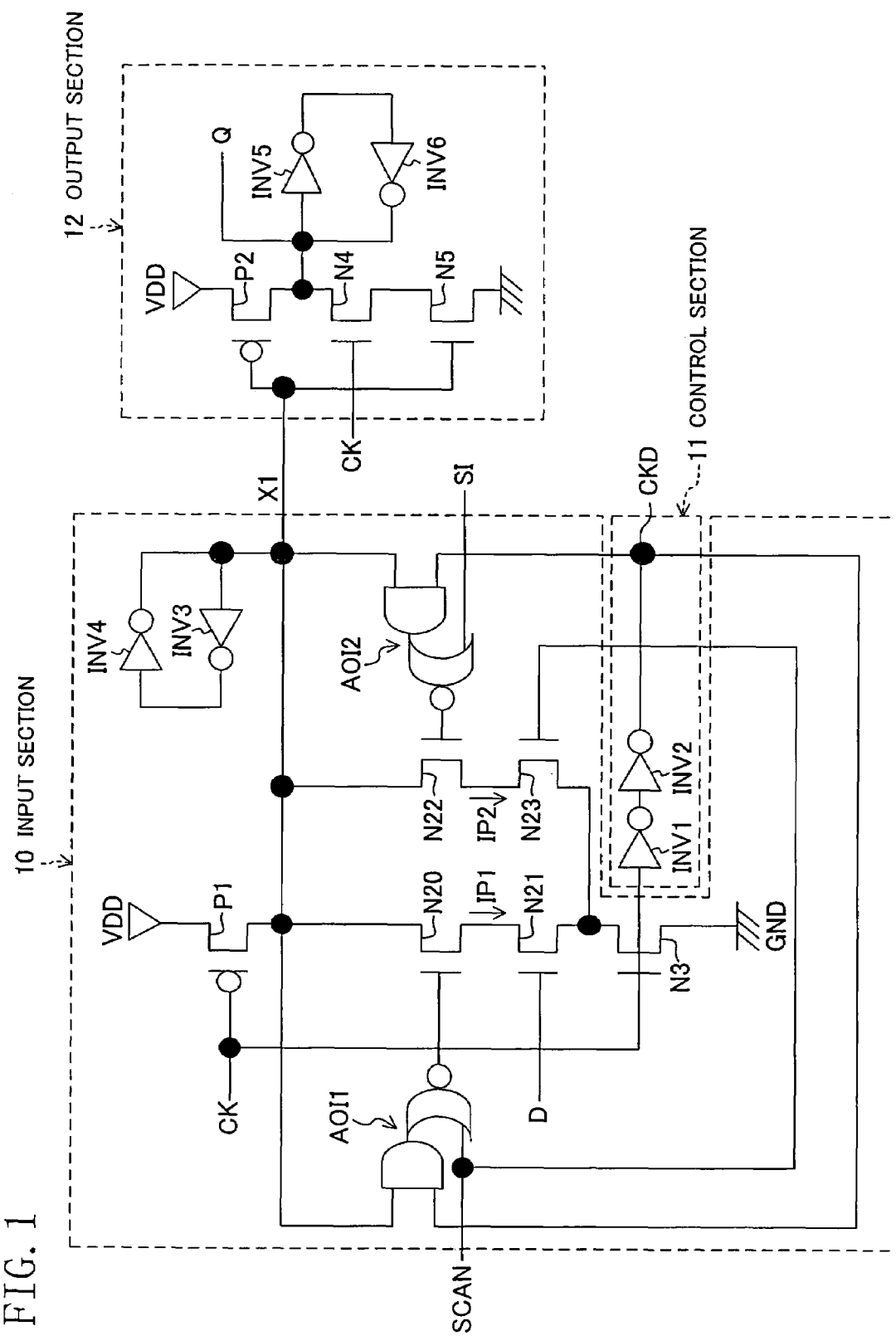
FIG. 1 is a circuit diagram showing a flip-flop circuit according to Embodiment 1 of the present invention.
Figure 2A:
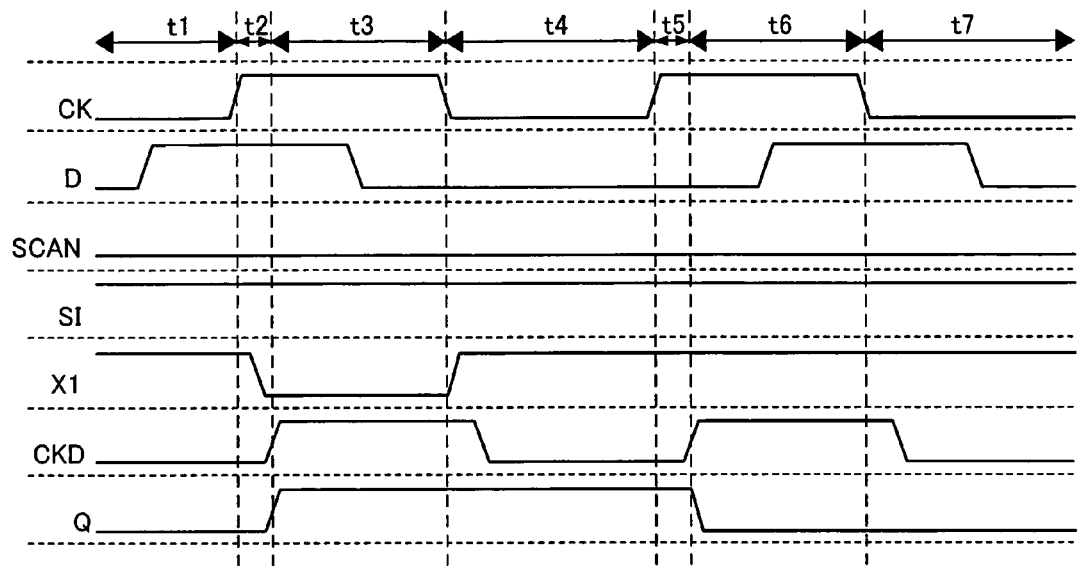
FIG. 2A is a timing diagram showing the operation of the flip-flop circuit when the test selection signal is at the low level.
Figure 2B:
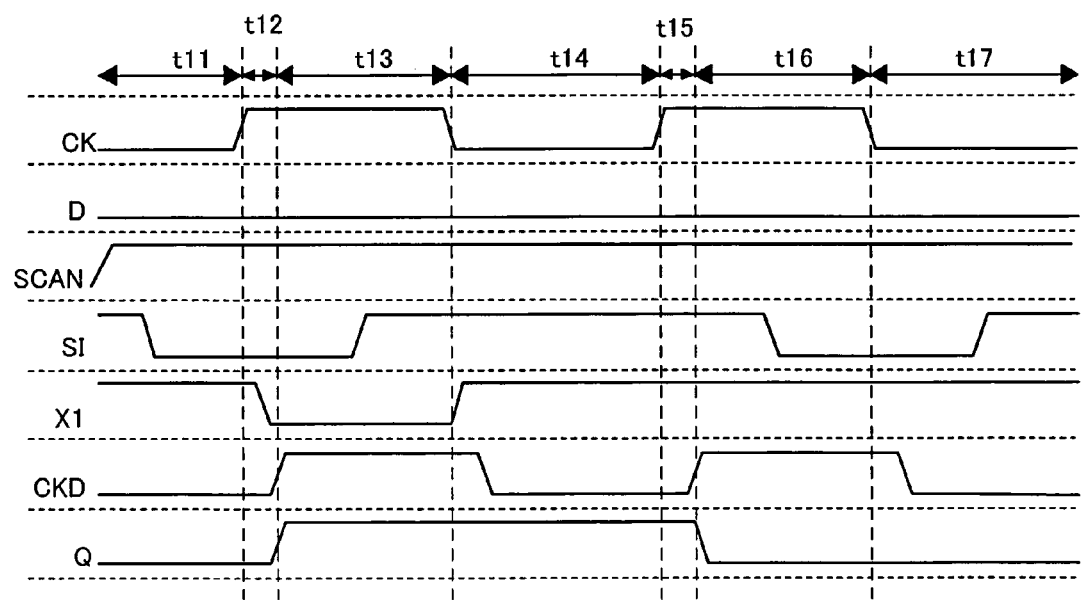
FIG. 2B is a timing diagram showing the operation of the flip-flop circuit when the test selection signal is at the high level.

FIG. 1 is a circuit diagram showing a scan flip-flop circuit of the present embodiment, and FIGS. 2A and 2B are timing diagrams showing the operation thereof.

In FIG. 1, D denotes a data signal (the first data signal), CK a clock signal, SI a test input signal (the second data signal), SCAN a test selection signal (the input selection signal), Q an output signal, CKD a node, X1 a node, VDD the power supply, and GND the ground.

In FIG. 1, 10 denotes an input section using a dynamic circuit, 11 a control section, and 12 an output section using a static circuit. The scan flip-flop circuit includes N-type transistors N3 to N5, N20 to N23, P-type transistors P1 to P2, inverter circuits INV1 to INV6, an AND/OR inverter circuit (the first logic gate forming the inverted logical sum circuit) AOI2, and another AND/OR inverter circuit (the second logic gate forming the inverted logical sum circuit) AOI1. The inverter circuits INV1 and INV2 are connected in series with each other for delaying the clock signal CK, and together form the control section 11. The output of the latter inverter circuit INV2, i.e., the potential of the node CKD, serves as a control signal. The inverter circuits INV3 to INV4 are provided for holding the value of the node n1, and the inverter circuits INV5 to INV6 are provided for holding the signal of the output signal Q. The N-type transistor N21 is a first N-type transistor (the first transistor), the N-type transistor N22 is a second N-type transistor (the second transistor), the N-type transistor N20 is a third N-type transistor (the third transistor), and the N-type transistor N23 is a fourth N-type transistor (the fourth transistor).

The detailed configuration and the operation of the scan flip-flop circuit of the present embodiment will now be described with reference to FIGS. 1, 2A and 2B.

When the test selection signal SCAN is at a low level (the first logic level), the N-type transistor N23 is OFF, whereby the current path (the second path) IP2 extending from the node X1 to the ground GND via the N-type transistors N22, N23 and N3 is cut off. In this case, the value of the node X1 is determined by the clock signal CK, the output of the AND/OR inverter circuit AOI1, and the data signal D. When the test selection signal SCAN is at a high level (the second logic level), the output of the AND/OR inverter circuit AOI1 is at the low level and the N-type transistor N20 is OFF, whereby the current path (the first path) IP1 extending from the node X1 to the ground GND via the N-type transistors N20, N21 and N3 is cut off, whereas the N-type transistor N23 is ON. In this case, the value of the node X1 is determined by the clock signal CK and the output of the AND/OR inverter circuit AOI2, which is dependent on the value of the test input signal SI.

First, a case where the test selection signal SCAN is at the low level and the output signal Q is dependent on the data signal D will be described (t1 to t7 in FIG. 2A).

In a period where the clock signal CK is at the low level (corresponding to t1, t4 and t7 in FIG. 2A), the node X1 is brought to the high level by the P-type transistor P1. Then, the N-type transistor N4 and the P-type transistor P2 are cut off, whereby the output signal Q is held at the previous value by the latch including the inverter circuits INV5 and INV6.

When the clock signal CK transitions to the high level, the node CKD does not transition to the high level immediately but does so after the delay through the inverter circuits INV1 to INV2. In a period where the clock signal CK is at the high level and the node CKD is at the low level (hereinafter referred to as the "evaluation period"; corresponding to t2 and t5 in FIG. 2A), the output of the AND/OR inverter circuit AOI1 is at the high level and the N-type transistor N20 is ON. Therefore, if the data signal D is at the high level in this period, the node X1 goes from the high level to the low level and the output signal Q is transitioned to the high level by the P-type transistor P2. If the input terminal D is at the low level in the evaluation period, the node X1 remains at the high level, and the output signal Q is transitioned to the low level by the N-type transistors N4 to N5. Then, the circuit transitions to a state where the clock signal CK is at the high level and the node CKD is at the high level (hereinafter referred to as the "hold period"; corresponding to t3 and t6 in FIG. 2A). If the node X1 is at the high level, the N-type transistor N20 is cut off by the AND/OR inverter circuit AOI1, whereby the level is held by the inverter circuits INV3 to INV4 without being influenced by the value of the data signal D. Where the circuit enters the hold period with the node X1 being at the low level, the P-type transistor P1 is cut off, whereby the node X1 is held at the low level by the inverter circuits INV3 to INV4, irrespective of the value of the data signal D.

Next, a case where the test selection signal SCAN is at the high level (corresponding to t11 to t17 in FIG. 2B) will be described.

In a period where the clock signal CK is at the low level (corresponding to t11, t14 and t17 in FIG. 2B), the node X1 is brought to the high level by the P-type transistor P1. Then, the N-type transistor N4 and the P-type transistor P2 are cut off, whereby the output signal Q is held at the previous value. Then, when the clock signal CK transitions to the high level, the node CKD does not transition to the high level immediately but does so after the delay through the inverter circuits INV1 to INV2. In a period where the clock signal CK is at the high level and the node CKD is at the low level (the "evaluation period"; corresponding to t12 and t15 in FIG. 2B), the output of the AND/OR inverter circuit AOI2 will be a signal obtained by inverting the test input signal SI. Since the test selection signal SCAN and the clock signal CK are both at the high level, the N-type transistors N23 and N3 are ON. Therefore, if the test input signal SI is at the low level (the output of the AND/OR inverter circuit AOI2 is at the high level) in this period, the node X1 goes from the high level to the low level and the output signal Q is transitioned to the high level by the P-type transistor P2. If the test input signal SI is at the high level (the output of the AND/OR inverter circuit AOI2 is at the low level) in the evaluation period, the node X1 remains at the high level, and the output signal Q is transitioned to the low level by the N-type transistors N4 to N5. Then, the circuit transitions to a state where the clock signal CK is at the high level and the node CKD is at the high level (the "hold period"; corresponding to t13 and t16 in FIGS. 2B). If the node X1 is at the high level, the N-type transistor N22 is cut off by the AND/OR inverter circuit AOI2, whereby the level is held by the inverter circuits INV3 to INV4 without being influenced by the value of the test input signal SI. Where the circuit enters the hold period with the node X1 being at the low level, the P-type transistor P1 is cut off, whereby the node X1 is held at the low level by the inverter circuits INV3 to INV4, irrespective of the value of the test input signal SI.

Normally, an inverter circuit includes two transistors and an AND/OR inverter circuit includes six MOS transistors. Accordingly, the flip-flop circuit of FIG. 1 can be realized with a total of 33 MOS transistors.

Figure 9:
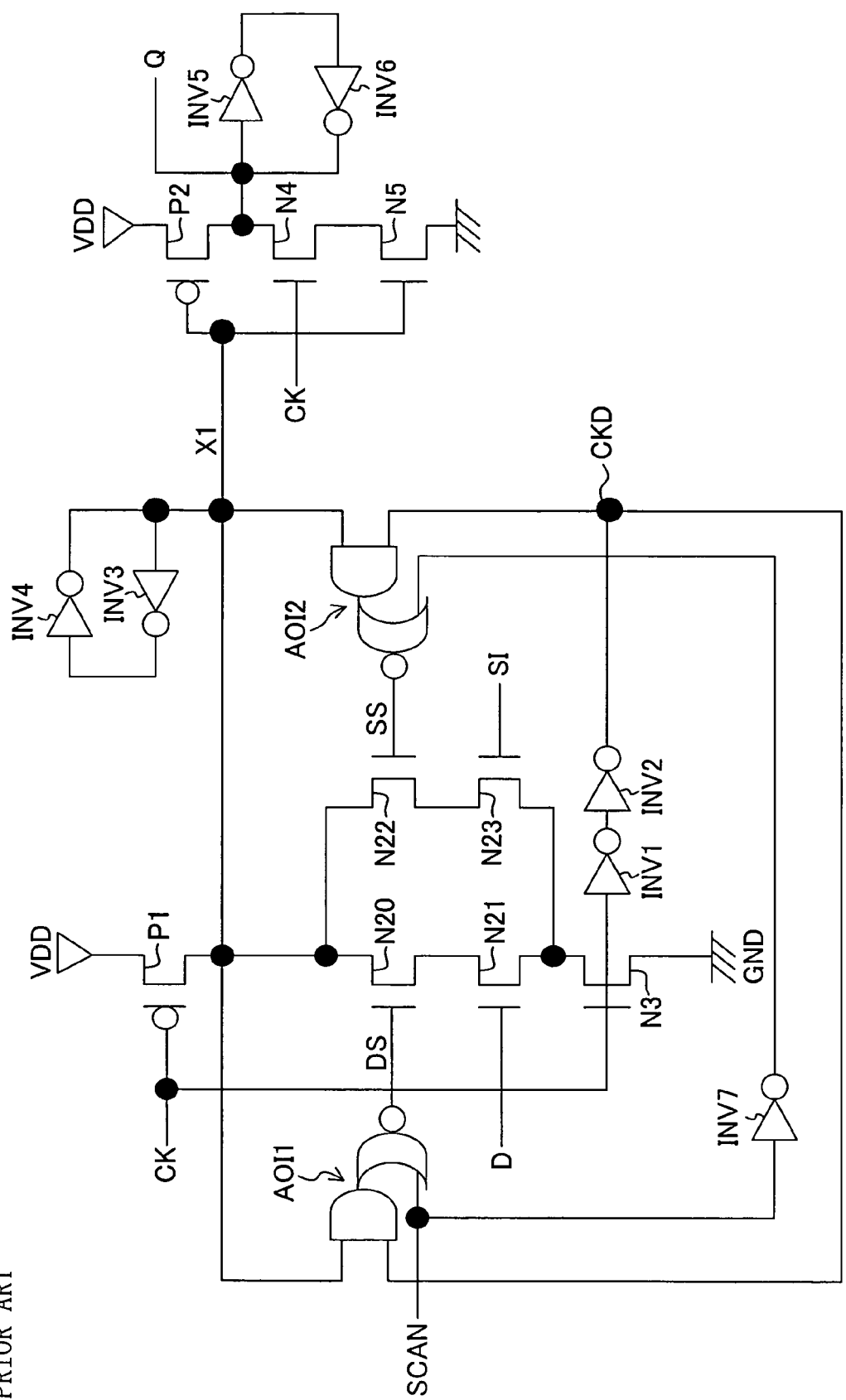
FIG. 9 is a circuit diagram showing another conventional flip-flop circuit.

In the present embodiment, as compared with Conventional Example 1 of FIG. 9, the number of MOS transistors increases by five, but the number of N-type transistors connected in series, to which the data signal is applied, can be reduced from four to three, whereby it is possible to improve the operating speed.

Moreover, it is possible to reduce the hold time in the test mode, during which a high-speed operation is not required but the hold time is required to be short as compared with the operation mode. This will now be described with reference to FIG. 3.

FIG. 3 is a timing diagram showing the relationship between the periods over which the data signal D, the test input signal SI and the output signal of the AND/OR inverter circuit AOI2 need to be held at predetermined levels, when the data are read as the clock signal CK transitions from low to high.

For each of the data signal D, the test input signal SI and the output signal of the AND/OR inverter circuit AOI2, the hatched area represents the period over which the data of the signal needs to be kept at a constant level when the clock signal CK rises.

The period over which the data needs to be asserted before the clock signal CK rises is referred to as the setup time.

In a semiconductor sequential logic circuit designed for synchronized operation, the following relationship needs to be satisfied.

Clock cycle<Flip-flop circuit delay time+Setup time+Maximum path delay of combined logic circuit Therefore, it can be said that a flip-flop circuit with a shorter setup time is a faster flip-flop circuit.

The period over which the data needs to be held after the clock signal CK rises is referred to as the hold time. With a long hold time, it may be necessary to insert a signal-delaying circuit between the circuit and the output of the preceding flip-flop circuit so as to prevent variations of data to be applied to the data signal D or the test input signal SI after the clock signal CK rises. This leads to an increase in the area. This is more problematic particularly because it is necessary to directly apply the output signal of the preceding flip-flop circuit to the test input signal SI.

In the present embodiment, it is assumed that the period over which the signal of the AND/OR inverter circuit AOI2 needs to hold data is equal to that of the data signal D. Then, there is a delay time Tdelay between the test input signal SI and the output of the AND/OR inverter circuit AOI2, whereby the hold time Thold_SI of the test input signal SI can be made shorter than the hold time Thold_D of the data signal D by Tdelay. Hence, $Thold\_SI = Thold\_D - Tdelay.$ Similarly, there is a relationship as follows between the setup time Tsetup_SI of the test input signal SI and the setup time Tsetup_D of the data signal D:

$Tsetup\_SI = Tsetup\_D + Tdelay.$

Thus, the setup time Tsetup_SI of the test input signal SI is greater than the setup time Tsetup_D of the data signal D. However, this will not be problematic because the delay time before the signal from the preceding flip-flop circuit is applied to the test input signal SI is typically short.

In the present embodiment, the hold time Thold_S of the test input signal SI can be shortened, and it is possible to reduce the number of delay elements (typically buffer circuits, or the like) between flip-flop circuits in a semiconductor integrated circuit employing the flip-flop circuit of the present embodiment.

In FIG. 1, the inverter circuits INV4 and INV6 may each be a tri-state inverter whose output is controlled to a high impedance by means of a clock signal.

Embodiment 2

A scan flip-flop circuit according to Embodiment 2 of the present invention will now be described with reference to the drawings.

Figure 4:
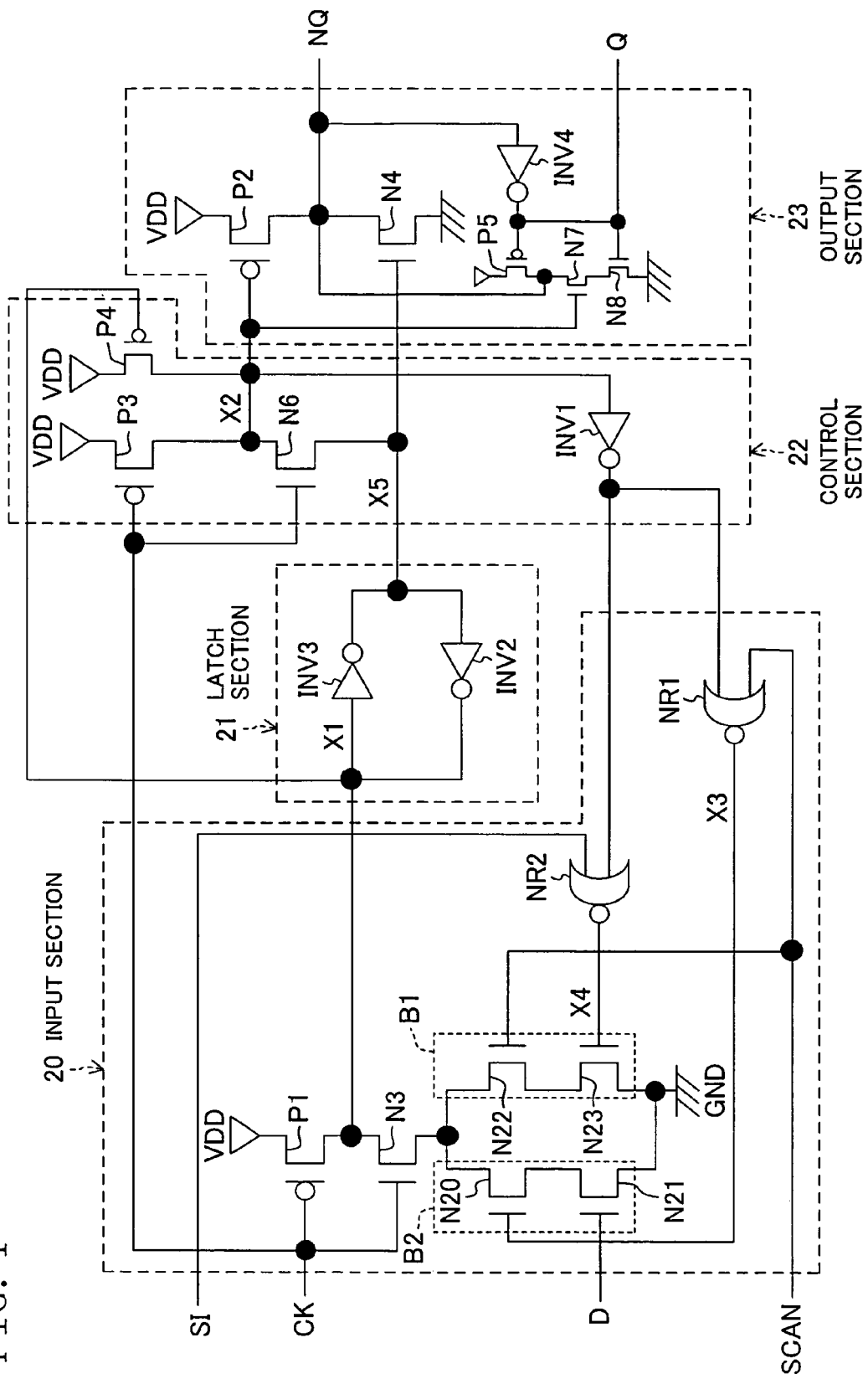
FIG. 4 is a circuit diagram showing a flip-flop circuit according to Embodiment 2 of the present invention.
Figure 5A:
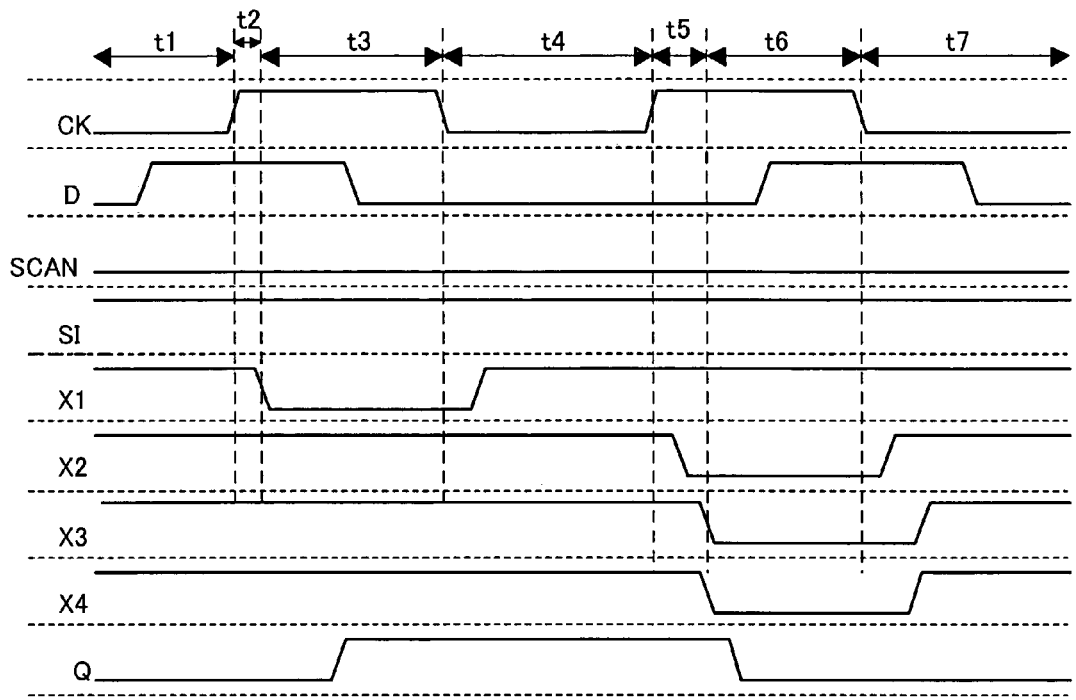
FIG. 5A is a timing diagram showing the operation of the flip-flop circuit when the test selection signal is at the low level.
Figure 5B:
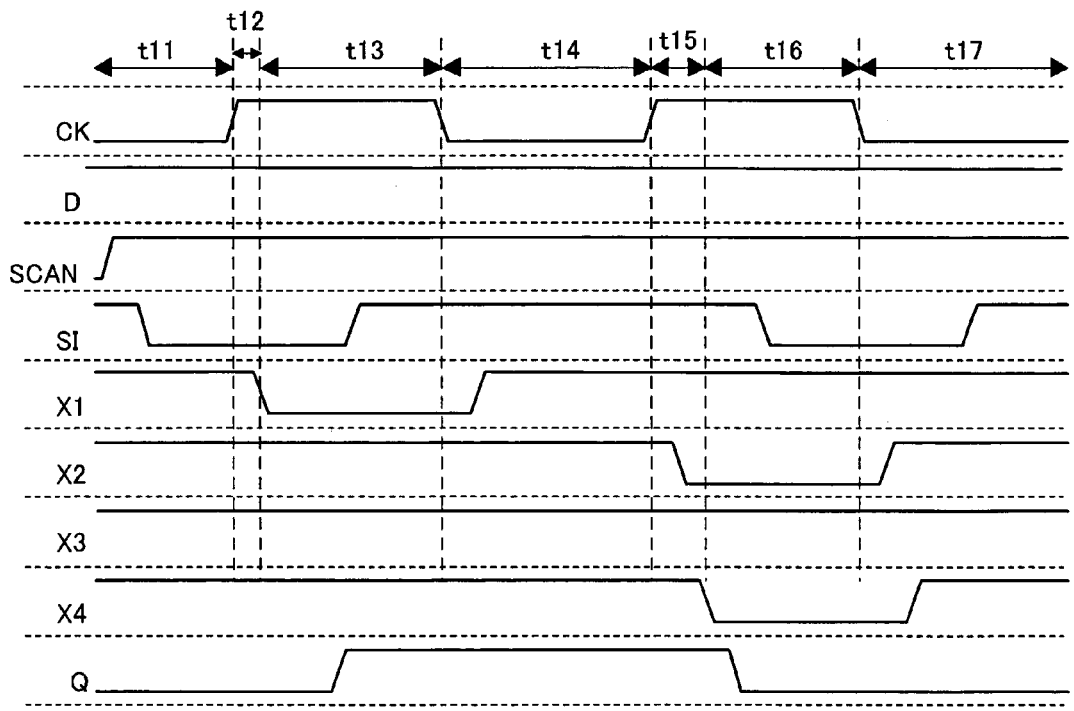
FIG. 5B is a timing diagram showing the operation of the flip-flop circuit when the test selection signal is at the high level.

FIG. 4 is a circuit diagram showing a scan flip-flop circuit of the present embodiment, and FIGS. 5A and 5B are timing diagrams showing the operation thereof.

In FIG. 4, D denotes a data signal (the first data signal), CK a clock signal, SI a test input signal (the second data signal), SCAN a test selection signal (the input selection signal), Q an output signal, NQ an inverted output signal, X1 to X4 nodes, VDD the power supply (the first potential supply node) of a predetermined power supply potential (the first potential), and GND the ground (the second potential supply node).

In FIG. 4, 20 denotes an input section, 21 a latch circuit, 22 a control section having a node (the first node) X2, and 23 an output section. The scan flip-flop circuit includes P-type transistors (the transistors of the first polarity) P1 to P5, N-type transistors (the transistors of the second polarity) N3, N4, N6 to N8, N20 to N23, inverter circuits INV1 to INV4, and NOR circuits NR1 and NR2. The inverter circuit INV1 is provided for delaying the signal of the node X2, the inverter circuits INV2 and INV3 are provided for holding the value of the node X1 and for transmitting the signal of the node X1 to the node X2.

In the input section 20, X1 is the second node, the P-type transistor P1 is the first P-type transistor, the N-type transistor N3 is the first N-type transistor, B1 is a first N-type logic block (the first logic block) including the second and third N-type transistors N22 and N23, B2 is a second N-type logic block (the second logic block) including the fourth and fifth N-type transistors N21 and N22, NR2 is a first logic gate being an NOR circuit, and NR1 is a second logic gate being an NOR circuit.

In a latch section 21, the inverter circuit INV3 is the first inverter circuit whose input side is connected to the node X1, the inverter circuit INV2 is the second inverter circuit whose input side is connected to a node (the third node) X5.

In the control section 22, the P-type transistor P2 is the second P-type transistor, the P-type transistor P4 is the third P-type transistor, the N-type transistor N4 is the fourth N-type transistor, and INV1 is a delay element for outputting the potential of the node X2 with a predetermined delay.

The detailed configuration and the operation of the scan flip-flop circuit of the present embodiment will now be described with reference to FIGS. 4, 5A and 5B.

When the test selection signal SCAN is at the low level (the first logic level), the N-type transistor N22 is OFF, whereby the current path extending from the node X1 to the ground GND via the N-type transistors N3, N22 and N23 is cut off. In this case, the value of the node X1 is determined by the data signal D when the clock signal CK is at the high level (the second logic level) and the node X3 being the output of the NOR circuit NR1 is at the high level. Therefore, the output signal Q and the inverted output signal NQ are also dependent on the data signal D. When the test selection signal SCAN is at the high level, the node X3 being the output of the NOR circuit NR1 is at the low level, and the N-type transistor N20 is OFF, whereby the current path extending from the node X1 to the ground GND via the N-type transistors N3, N20 and N21 is cut off. In this case, the value of the node X1 is dependent on the output signal X4 of the NOR circuit NR2, which receives the test input signal SI and the output of the inverter circuit INV1, when the clock signal CK is at the high level. Thus, when the output of the inverter circuit INV1 is at the low level, the value is dependent on the test input signal SI. Therefore, the output signal Q and the inverted output signal NQ are also dependent on the test input signal SI.

First, a case where the test selection signal SCAN is at the low level and the output signal Q is dependent on the data signal D will be described (t1 to t7 in FIG. 5A).

In a period where the clock signal CK is at the low level (corresponding to t1, t4 and t7 in FIG. 5A), the node X1 is brought to the high level by the P-type transistor P1 and the node X2 is brought to the high level by the P-type transistor P3. Then, the N-type transistor N4 and the P-type transistor P2 are cut off, whereby the output signal Q is held at the previous value by the inverter circuit INV5, the P-type transistor P5 and the N-type transistors N7 and N8.

In a period where the clock signal CK is at the high level and the node X3 is at the high level (corresponding to t2 and t5 in FIG. 5A), the N-type transistor N20 is ON, whereby the node X1 goes from the high level to the low level if the data signal D is at the high level in this period. Then, the output of the inverter circuit INV3 transitions from the low level to the high level. Therefore, the nodes X2 and X3 are kept at the high level (corresponding to t3 in FIG. 5A). Then, the N-type transistor N4 is turned ON, and the inverted output signal NQ transitions to the low level and the output signal Q to the high level. If the input terminal D is at the low level, the node X1 remains at the high level, the output of the inverter circuit INV4 also remains at the low level, and the N-type transistor N6 is ON, whereby the node X2 transitions from the high level to the low level. Then, the node X3 being the output of the NOR circuit NR1 transitions to the low level. Then, the P-type transistor P2 is turned ON, and the inverted output signal NQ transitions to the high level and the output signal Q to the low level.

When the clock signal CK is at the high level and the node X3 is at the low level (corresponding to t6 in FIG. 5A), the N-type transistor N20 is cut off, whereby the level of the node X1 is held by the inverter circuits INV2 to INV3 without being influenced by the value of the data signal D. When the clock signal CK is at the high level and the node X1 is at the low level, the P-type transistor P1 is cut off, whereby the node X1 is held at the low level by the inverter circuits INV2 to INV3, irrespective of the value of the data signal D.

Next, a case where the test selection signal SCAN is at the high level and the output signal Q is dependent on the test input signal SI will be described (corresponding to t11 to t17 in FIG. 5B).

In a period where the clock signal CK is at the low level (corresponding to t11, t14 and t17 in FIG. 5A), the node X1 is brought to the high level by the P-type transistor P1 and the node X2 is brought to the high level by the P-type transistor P3. Then, the N-type transistor N4 and the P-type transistor P2 are cut off, whereby the inverted output signal NQ and the output signal Q are held at the previous values by the inverter circuit INV5, the P-type transistor P5 and the N-type transistors N7 and N8.

When the clock signal CK is at the high level, the N-type transistors N3 and N22 are ON. Over a certain period (corresponding to t12 and t15 in FIG. 5B) after the clock signal CK transitions from the low level to the high level, the output of the inverter circuit INV1, which receives a high-level signal of the node X1, is at the low level. Therefore, in this period, if the test input signal SI is at the low level, the node X4 is at the high level and the N-type transistor N23 is ON, whereby the node X1 goes from the high level to the low level. Then, the output of the inverter circuit INV3 transitions from the low level to the high level. Therefore, the nodes X2 and X4 are kept at the high level (corresponding to t13 in FIG. 5B). Then, the N-type transistor N4 is turned ON, and the inverted output signal NQ transitions to the low level and the output signal Q to the high level. If the input terminal D is at the low level, the node X1 remains at the high level, the output of the inverter circuit INV3 also remains at the low level, and the N-type transistor N6 is ON, whereby the node X2 transitions from the high level to the low level. Then, the node X4 being the output of the inverter circuit INV2 transitions to the low level. Then, the P-type transistor P2 is turned ON, and the inverted output signal NQ transitions to the high level and the output signal Q to the low level.

When the clock signal CK is at the high level and the node X4 is at the low level (corresponding to t16 in FIG. 5B), the N-type transistor N23 is cut off. Then, the node X2 is at the low level and the output of the inverter circuit INV1 is at the high level, whereby the output X4 of the NOR circuit NR2 remains at the low level even if the value of the test input signal SI changes. Thus, the level of the node X1 is held by the inverter circuits INV2 to INV3 without being influenced by the test input signal SI.

When the clock signal CK is at the high level and the node X1 is at the low level, the P-type transistor P1 is cut off, whereby the node X1 is kept at the low level by the inverter circuits INV2 to INV3, irrespective of the value of the test input signal SI.

Normally, an inverter circuit includes two transistors and a 2-input NOR circuit includes four transistors. Accordingly, the flip-flop circuit of the present embodiment shown in FIG. 4 can be realized with a total of 30 transistors.

Figure 8:
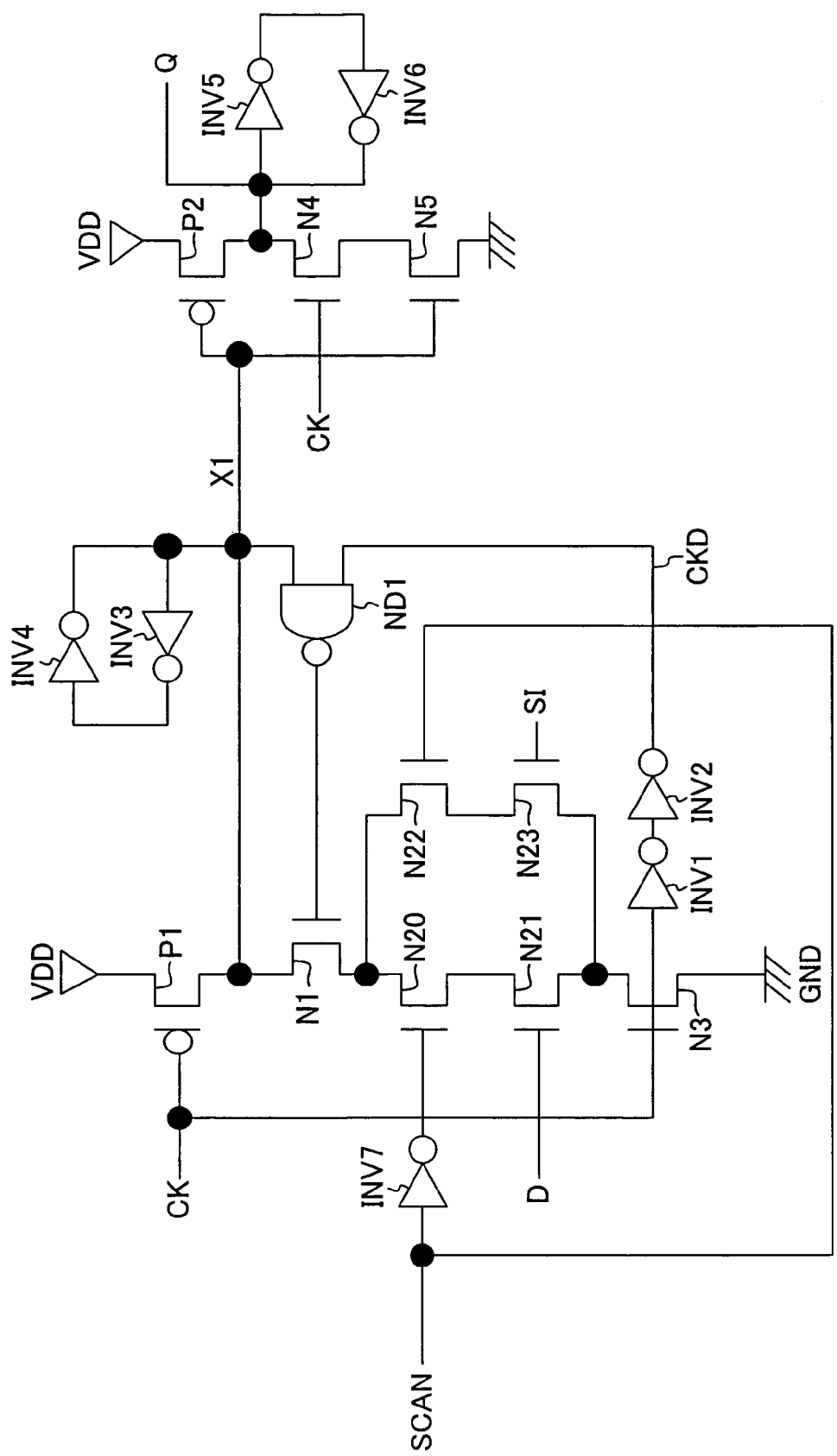
FIG. 8 is a circuit diagram showing a conventional flip-flop circuit.

In the present embodiment, as compared with Conventional Example 1 of FIG. 8, the number of transistors increases by two, but the number of N-type transistors connected in series, to which the data signal is applied, can be reduced from four to three, whereby it is possible to improve the operating speed.

In the present embodiment, as in Embodiment 1, the hold time of the test input signal can be shortened, and it is possible to reduce the number of delay elements (typically buffer circuits, or the like) between flip-flop circuits in a semiconductor integrated circuit employing the flip-flop circuit of the present embodiment.

While the N-type transistor N3, which receives the clock signal CK, is located on the side closer to the node X1 in the present embodiment, it may be located on the side closer to the ground GND. Moreover, by setting the current driving power of the N-type transistor N8 to be about ⅕ that of the P-type transistor P3, it is possible to eliminate the N-type transistor N7. Then, the flip-flop circuit can be realized with a total of 29 transistors.

In FIG. 4, the inverter circuit INV2 may be a tri-state inverter whose output is controlled to a high impedance by means of a clock signal.

Embodiment 3

A scan flip-flop circuit according to Embodiment 3 of the present invention will now be described with reference to the drawings.

Figure 6:
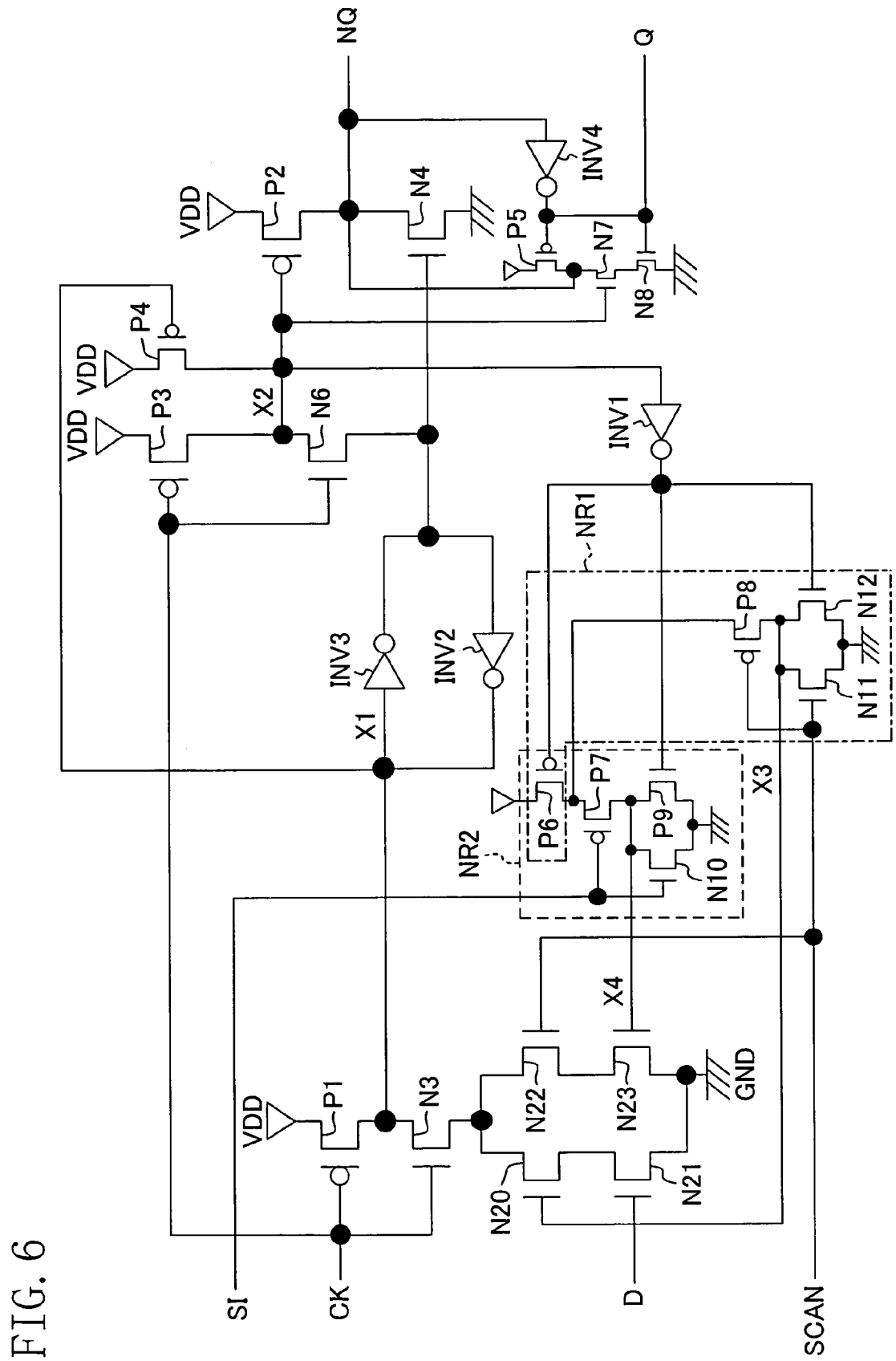
FIG. 6 is a circuit diagram showing a flip-flop circuit according to Embodiment 3 of the present invention.

FIG. 6 is a circuit diagram showing a scan flip-flop circuit of the present embodiment. In the configuration of FIG. 6, one or more of the P-type transistors are shared between the NOR circuits NR1 and NR2 of the flip-flop circuit, as compared with that of Embodiment 2 shown in FIG. 4. In the present embodiment, like elements to those of Embodiment 2 will be denoted by like reference numerals and will not be further described below. In FIG. 6, P6 to P8 denote P-type transistors, and N9 to N12 N-type transistors. The P-type transistor P6 is the transistor that is shared between the NOR circuits NR1 and NR2.

While the NOR circuits NR1 and NR2 shown in FIG. 4 require eight transistors, the present embodiment realizes a similar function with seven transistors, including the P-type transistors P6 to P8 and the N-type transistors N9 to N12.

In the present embodiment, the number of MOS transistors can be reduced by one, in addition to realizing effects described above in Embodiment 2.

In FIG. 6, the inverter circuit INV2 may be a tri-state inverter whose output is controlled to a high impedance by means of a clock signal.

Embodiment 4

A scan flip-flop circuit according to Embodiment 4 of the present invention will now be described with reference to the drawings.

Figure 7:
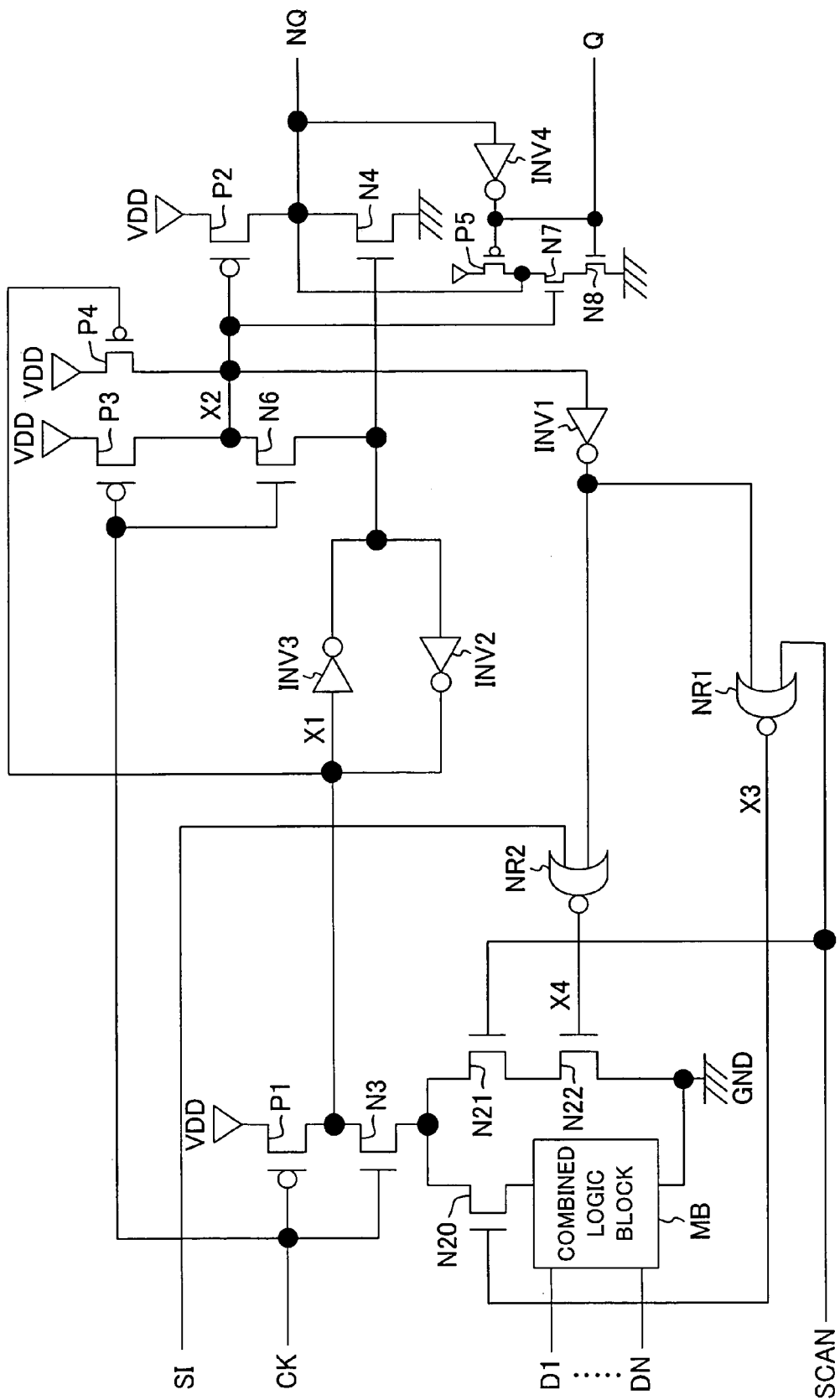
FIG. 7 is a circuit diagram showing a flip-flop circuit according to Embodiment 4 of the present invention.

FIG. 7 is a circuit diagram showing a flip-flop circuit of the present embodiment. In the present embodiment, like elements to those of Embodiments 1 to 3 shown in FIGS. 1, 4 and 6 are denoted by like reference numerals and will not be further described below.

In FIG. 7, D1 to DN are a group of data signals including a plurality of input signals, and a combined logic block MB (the internal configuration thereof is not shown) is a logic circuit including an equal number of N-type transistors to the number of data included in the group of data signals.

The circuit of FIG. 7 similar to that of Embodiment 2 shown in FIG. 4, except that the N-type transistor N21 is replaced by the combined logic block MB. Since the combined logic block MB can be realized with only N-type transistors, the number of transistors can be reduced as compared with a case where a similar function is realized by flip-flop circuits and CMOS logic circuits.

In addition to the effect of Embodiment 2, the present embodiment allows for an increase in the function of the flip-flop circuit and, at the same time, a reduction in the total circuit area of the entire chip.

In FIG. 7, the inverter circuit INV2 may be a tri-state inverter whose output is controlled to a high impedance by means of a clock signal.

While P-type transistors are used as the transistors of the first polarity and N-type transistors as the transistors of the second polarity in the description above, the present invention is not limited thereto. It is understood that the transistors of the first polarity may be N-type transistors and the transistors of the second polarity may be P-type transistors. In that case, the description above still applies only by replacing the logic low level and the logic high level with each other and replacing the power supply potential and the ground potential with each other.

What is claimed is:

1. A flip-flop circuit, comprising:
   an input section including a plurality of transistors for receiving first logic information including a clock signal, a first data signal, a second data signal and an input selection signal to output second logic information based on the first logic information;
   a control section for producing a control signal being dependent at least on the clock signal; and
   an output section for outputting a signal based on the second logic information, wherein:
   the second logic information is transmitted from the input section to the output section via a first node;
   the input section outputs, to the first node, the second logic information as a signal of a second logic level when the clock signal is at a first logic level, and outputs, to the first node, a signal determined based on the first logic information and the control signal when the clock signal transitions from the first logic level to the second logic level;
   in the input section, the first data signal is input to a gate terminal of a first transistor included in a first path, along which a current flows when the first node transitions from the second logic level to the first logic level; and
   in the input section, an output signal of a first logic gate, which receives at least the control signal and the second data signal, is input to a gate terminal of a second transistor included in a second path, along which a current flows when the first node transitions from the second logic level to the first logic level, the second path does not include the first transistor.

2. The flip-flop circuit of claim 1, wherein:
   an output signal of a second logic gate, which receives at least the input selection signal and the control signal, is input to a gate terminal of a third transistor, which is connected in series with the first transistor and which is included in the first path; and
   the input selection signal is input to a gate terminal of a fourth transistor, which is connected in series with the second transistor and which is included in the second path.

3. The flip-flop circuit of claim 2, wherein the first and second logic gates are each an inverted logical sum circuit.

4. The flip-flop circuit of claim 3, wherein a single transistor of a first polarity is used in a shared manner as a transistor of the first polarity, which forms a part of the inverted logical sum circuit being the first logic gate and a gate terminal of which receives the control signal, and as a transistor of the first polarity, which forms a part of the inverted logical sum circuit being the second logic gate and a gate terminal of which receives the control signal.

5. The flip-flop circuit of claim 1, wherein the first and second logic gates are each an inverted logical sum circuit.

6. The flip-flop circuit of claim 5, wherein a single transistor of a first polarity is used in a shared manner as a transistor of the first polarity, which forms a part of the inverted logical sum circuit being the first logic gate and a gate terminal of which receives the control signal, and as a transistor of the first polarity, which forms a part of the inverted logical sum circuit being the second logic gate and a gate terminal of which receives the control signal.

7. A flip-flop circuit, comprising:
an input section including a plurality of transistors of a second polarity and receiving a clock signal, a first data signal, a second data signal and an input selection signal;
a latch circuit for latching an output of the input section;
a control section including a first node; and
an output section for outputting a signal from an output terminal, wherein:
the input section includes a first transistor of a first polarity provided between a first potential supply node and a second node, a first transistor of the second polarity whose drain is connected to the second node, and first and second logic blocks connected in parallel between a source of the first transistor of the second polarity and a second potential supply node;
the first logic block includes second and third transistors of the second polarity connected in series, the second logic block including fourth and fifth transistors of the second polarity connected in series;
the clock signal is input to a gate terminal of the first transistor of the first polarity and a gate terminal of the first transistor of the second polarity;
the input selection signal is input to a gate terminal of the second transistor of the second polarity, and an output signal of a first logic gate, which receives a control signal supplied via the first node and the second data signal, is input to a gate terminal of the third transistor of the second polarity;
the first data signal is input to a gate terminal of the fourth transistor of the second polarity, and an output signal of a second logic gate, which receives the control signal supplied via the first node and the input selection signal, is input to a gate terminal of the fifth transistor of the second polarity;
the latch circuit includes a first inverter for receiving a signal supplied via the second node of the input section to output, to a third node, a signal obtained by inverting a logic of the received signal, and a second inverter for receiving a signal supplied via the third node to output, to an input of the first inverter, a signal obtained by inverting a logic of the received signal;
the control section includes a second transistor of the first polarity, a third transistor of the first polarity, and a sixth transistor of the second polarity;
the second transistor of the first polarity and the sixth transistor of the second polarity are provided in series between the first potential supply node and the third node;
the third transistor of the first polarity is provided between the first potential supply node and the first node, the first node being an intermediate node between the second transistor of the first polarity and the sixth transistor of the second polarity;
the clock signal is input to a gate terminal of the second transistor of the first polarity and a gate terminal of the sixth transistor of the second polarity;
a signal at the second node is input to a gate terminal of the third transistor of the first polarity; and the output section, receiving a signal supplied via the first node of the control section and a signal supplied via the third node of the latch circuit, holds a signal level of the output terminal when the signal supplied via the first node of the control section is at a second logic level and the signal supplied via the third node of the latch circuit is at a first logic level, outputs to the output terminal a signal of a logic dependent on the signal supplied via the first node when the signal supplied via the first node of the control section is at the first logic level, and outputs a signal of a logic dependent on the signal supplied via the third node when the signal supplied via the third node is at the second logic level.

8. The flip-flop circuit of claim 7, wherein the first and second logic gates are each an inverted logical sum circuit.

9. The flip-flop circuit of claim 8, wherein a single transistor of a first polarity is used in a shared manner as a transistor of the first polarity, which forms a part of the inverted logical sum circuit being the first logic gate and a gate terminal of which receives the control signal, and as a transistor of the first polarity, which forms a part of the inverted logical sum circuit being the second logic gate and a gate terminal of which receives the control signal.

10. The flip-flop circuit of claim 7, wherein:
the input section receives a group of three or more data signals, including the first and second data signals; and
the flip-flop circuit includes three or more logic blocks receiving the group of data signals and including the first and second logic blocks.

11. A flip-flop circuit, comprising:
an input section including a plurality of transistors of a second polarity and receiving a clock signal, a first data signal, a second data signal and an input selection signal;
a latch circuit for latching an output of the input section;
a control section including a first node; and
an output section for outputting a signal from an output terminal, wherein:
the control section receives the clock signal and outputs a control signal being dependent on an output of a delay element for delaying the clock signal by a predetermined period and outputting the delayed signal;
the input section includes a first transistor of a first polarity provided between a first potential supply node and a second node, a first transistor of the second polarity whose drain is connected to the second node, and first and second logic blocks connected in parallel between a source of the first transistor of the second polarity and second potential supply node;
the first logic block includes second and third transistors of the second polarity connected in series, and the second logic block includes fourth and fifth transistors of the second polarity connected in series;
the clock signal is input to a gate terminal of the first transistor of the first polarity and a gate terminal of the first transistor of the second polarity;
the input selection signal is input to a gate terminal of the second transistor of the second polarity, and an output signal of a first logic gate, which receives a control signal supplied via the first node and the second data signal, is input to a gate terminal of the third transistor of the second polarity;
the first data signal is input to a gate terminal of the fourth transistor of the second polarity, and an output signal of a second logic gate, which receives the control signal supplied via the first node and the input selection signal, is input to a gate terminal of the fifth transistor of the second polarity;

the latch circuit includes a first inverter for receiving a signal supplied via the second node of the input section to output, to a third node, a signal obtained by inverting a logic of the received signal, and a second inverter for receiving a signal supplied via the third node to output, to an input of the first inverter, a signal obtained by inverting a logic of the received signal; and the output section holds a signal of the output terminal when a signal of a first logic level is applied to a clock terminal, and outputs to the output terminal a signal of a logic dependent on a signal of the second node when a signal of a second logic level is applied to the clock terminal.

12. The flip-flop circuit of claim 11, wherein the first and second logic gates are each an inverted logical sum circuit.

13. The flip-flop circuit of claim 12, wherein a single transistor of a first polarity is used in a shared manner as a transistor of the first polarity, which forms a part of the inverted logical sum circuit being the first logic gate and a gate terminal of which receives the control signal, and as a transistor of the first polarity, which forms a part of the inverted logical sum circuit being the second logic gate and a gate terminal of which receives the control signal.

14. The flip-flop circuit of claim 11, wherein:

the input section receives a group of three or more data signals, including the first and second data signals; and the flip-flop circuit includes three or more logic blocks receiving the group of data signals and including the first and second logic blocks.

* * * * *